(12) United States Patent
Park et al.

(10) Patent No.: US 9,751,051 B2
(45) Date of Patent: Sep. 5, 2017

(54) HYDROGEN SEPARATION MEMBRANE, AND METHOD FOR MANUFACTURING SAME

(71) Applicant: KOREA INSTITUTE OF ENERGY RESEARCH, Daejeon (KR)

(72) Inventors: Jongsoo Park, Daejeon (KR); Shinkun Ryi, Daejeon (KR); Chunboo Lee, Daejeon (KR); Sungwook Lee, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 76 days.

(21) Appl. No.: 14/651,596

(22) PCT Filed: Oct. 31, 2013

(86) PCT No.: PCT/KR2013/009760
§ 371 (c)(1),
(2) Date: Jun. 11, 2015

(87) PCT Pub. No.: WO2014/092333
PCT Pub. Date: Jun. 19, 2014

(65) Prior Publication Data
US 2015/0328590 A1 Nov. 19, 2015

(30) Foreign Application Priority Data
Dec. 11, 2012 (KR) .................. 10-2012-0143159

(51) Int. Cl.
*B01D 69/12* (2006.01)
*B01D 71/02* (2006.01)
(Continued)

(52) U.S. Cl.
CPC ........... *B01D 69/12* (2013.01); *B01D 53/228* (2013.01); *B01D 63/081* (2013.01);
(Continued)

(58) Field of Classification Search
CPC ..... B01D 53/22; B01D 53/228; B01D 63/081; B01D 63/141; B01D 67/0072;
(Continued)

(56) References Cited

U.S. PATENT DOCUMENTS 7,018,446 B2   3/2006 Alvin et al.
2005/0276990 A1* 12/2005 Kohara ............... C23C 8/02
428/469

(Continued)

FOREIGN PATENT DOCUMENTS

JP   2004216275 A   8/2004
JP   2006204990 A   8/2006
(Continued)

OTHER PUBLICATIONS

English language machine translation for JP 2008-237945. Retrieved from www.translationsportal.epo.org on Oct. 20, 2016.*
(Continued)

*Primary Examiner* — Jason M Greene
(74) *Attorney, Agent, or Firm* — Hauptman Ham, LLP

(57) ABSTRACT

The present invention relates to a hydrogen separation membrane and to a method for manufacturing same, which is provided for restraining the diffusion of and for imparting excellent bonding characteristics between a porous support and a palladium-based metal separation membrane. The hydrogen separation membrane according to the present invention comprises: a porous support of a metal material or a ceramic material; a buffer layer formed as a plurality of columns by using a ceramic material on the porous support; and a palladium-based metal separation membrane formed on the buffer layer for separating hydrogen. In said case, the buffer layer includes an oxide-based ceramic material of either $MO_y$, (M is Ti, Zr), wherein which the composition of oxygen is $1<y<2$, or $Al_2O_z$, wherein which the composition
(Continued)

of oxygen is 2<z<3, and may be formed as a plurality of layers.

14 Claims, 11 Drawing Sheets

(51) Int. Cl.
    *B01D 63/08*      (2006.01)
    *B01D 67/00*      (2006.01)
    *C23C 14/34*      (2006.01)
    *C23C 8/10*      (2006.01)
    *B01D 53/22*      (2006.01)
    *B01D 69/14*      (2006.01)
    *C01B 3/50*      (2006.01)

(52) U.S. Cl.
    CPC ....... *B01D 67/0072* (2013.01); *B01D 69/141* (2013.01); *B01D 71/022* (2013.01); *B01D 71/024* (2013.01); *C01B 3/505* (2013.01); *C23C 8/10* (2013.01); *C23C 14/34* (2013.01); *B01D 2257/108* (2013.01); *B01D 2325/20* (2013.01); *B01D 2325/28* (2013.01)

(58) Field of Classification Search
    CPC .... B01D 69/12; B01D 69/141; B01D 71/022; B01D 71/024; C01B 3/503; C01B 3/505; C23C 14/34
    See application file for complete search history.

(56) References Cited

U.S. PATENT DOCUMENTS

| | | | |
|---|---|---|---|
| 2007/0044663 A1 | 3/2007 | Song et al. | |
| 2007/0251389 A1* | 11/2007 | Katsir | B01D 69/12 96/11 |
| 2009/0277331 A1* | 11/2009 | Li | B01D 69/12 96/11 |
| 2011/0020192 A1* | 1/2011 | Baumann | B01D 53/228 422/211 |
| 2011/0042301 A1* | 2/2011 | Zhang | B01D 69/10 210/500.21 |
| 2013/0139878 A1* | 6/2013 | Bhatnagar | H01L 31/02246 136/256 |
| 2014/0144322 A1* | 5/2014 | Hwang | B01D 53/228 96/11 |

FOREIGN PATENT DOCUMENTS

| | | | | |
|---|---|---|---|---|
| JP | 2006-204990 | * | 10/2006 | ............ B01D 69/12 |
| JP | 2008-237945 | * | 10/2008 | ............ B01D 69/12 |
| JP | 2008237945 A | | 10/2008 | |

OTHER PUBLICATIONS

English language machine translation for JP 2006-204990. Retrieved from www.translationsportal.epo.org on Oct. 20, 2016.*
International Search Report for PCT/KR2013/009760 mailed on Feb. 19, 2014.
Office Action issued for corresponding Korean Application No. 10-2012-0143159 mailed on May 9, 2014.
Notice of Allowance issued for corresponding Korean Application No. 10-2012-0143159 mailed on Nov. 18, 2014.

* cited by examiner

HYDROGEN SEPARATION MEMBRANE, AND METHOD FOR MANUFACTURING SAME

CROSS REFERENCE TO RELATED APPLICATION

This application claims the priority of Korean Patent Application No. 10-2012-0143159filed on Dec. 11, 2012 in the Korean Patent and Trademark Office. Further, this application is the National Phase application of International Application No. PCT/KR2013/009760 filed on Oct. 31, 2013, which is incorporated herein by reference in its entirety.

TECHNICAL FIELD

The present invention relates to a hydrogen separation membrane, and a method for manufacturing the same, and more particularly, to a hydrogen separation membrane capable of suppressing the diffusion between a porous support and a palladium-based metal separation membrane and simultaneously giving a good bonding force between the porous support and the palladium-based metal separation membrane, and a method for manufacturing the same.

BACKGROUND ART

Hydrogen has received attention as a main energy source which may replace conventional energy sources in the future since it is light, abundant, and efficient in environments. However, since impurities are included in hydrogen obtained from resources including hydrogen, such as water, natural gas, coal, biomass, and the like, hydrogen should be separated and purified in a process before its use.

As methods of separating and purifying hydrogen, a large number of techniques such as a cryogenic air separation method, an adsorption method, or a hydrogen separation method using a separation membrane have been proposed. Among theses, the hydrogen separation method using the separation membrane is one of widely used hydrogen separation methods since it has advantages in that it may save energy more effectively and may be more easily handled than the other hydrogen separation methods, and instruments may be manufactured in a smaller scale.

In particular, since a palladium-based metal separation membrane has high hydrogen permeability and excellent hydrogen separability, the hydrogen separation method using the separation membrane is clearly superior to the other separation methods. Also, the hydrogen separation method using the palladium-based metal separation membrane may be used in fuel cells, or used to efficiently obtain pure hydrogen for other processes in which hydrogen is consumed, and may be applied in various fields such as use in a hydrogenation or dehydrogenation process so as to increase the number of target products.

Such a metal separation membrane is generally used in such a way that it is stacked on a surface of a porous support, and used so as to improve a hydrogen permeation rate. However, when a metal separation membrane is directly formed on a surface of the porous support made of a metal material in the porous support, the hydrogen permeability may be reduced due to interdiffusion therebetween. Therefore, a buffer layer made of a ceramic material should be sandwiched between the porous support and the metal separation membrane. A sol-gel method has been used as a method of forming such a buffer layer.

However, although the buffer layer formed using a conventional sol-gel method may restrain the diffusion between the porous support and the metal separation membrane, a bonding force between the porous support and the metal separation membrane may be reduced due to the presence of the buffer layer sandwiched therebetween. For example, as shown in FIG. 10, a metal separation membrane 130 may be peeled off from a porous support 110.

DISCLOSURE

Technical Problem

Therefore, it is an aspect of the present invention to provide a hydrogen separation membrane capable of maintaining a good bonding force between a porous support and a metal separation membrane with a buffer layer disposed therebetween, and a method for manufacturing the same.

It is another aspect of the present invention to provide a hydrogen separation membrane capable of improving a hydrogen permeation rate, and a method for manufacturing the same.

Technical Solution

To solve the above problems, one aspect of the present invention provides a hydrogen separation membrane which includes a porous support made of a metal or ceramic material, a buffer layer made of a ceramic material, and formed in the form of a plurality of columns on the porous support, wherein the buffer layer is formed of a plurality of layers, and a palladium-based metal separation membrane formed on the buffer layer and capable of separating hydrogen.

For the hydrogen separation membrane according to one exemplary embodiment of the present invention, the buffer layer may include a layer made of an oxide-based ceramic material such as $MO_y$ (M is Ti or Zr) where the composition of oxygen is $1<y<2$, or $Al_2O_z$ where the composition of oxygen is $2<z<3$.

For the hydrogen separation membrane according to one exemplary embodiment of the present invention, the buffer layer may have neighboring layers formed of different ceramic materials.

For the hydrogen separation membrane according to one exemplary embodiment of the present invention, the buffer layer may be in the form of the plurality of columns having a diameter of 10 to 200 nm.

For the hydrogen separation membrane according to one exemplary embodiment of the present invention, the buffer layer may be formed separately, or formed in the form of a plurality of clusters.

In the hydrogen separation membrane according to one exemplary embodiment of the present invention, the buffer layer may be formed of first to third buffer layers. The first buffer layer may be formed on the porous support, and formed of one oxide-based ceramic material selected from the group consisting of $TiO_y$, $ZrO_y$, and $Al_2O_z$ where the composition of oxygen is $1<y<2$, or $2<z<3$. The second buffer layer may be formed on the first buffer layer, and formed of an oxide-based ceramic material including one selected from the group consisting of Ti, Zr, Al, Si, Ce, La, Sr, Cr, V, Nb, Ga, Ta, W, and Mo. Also, the third buffer layer may be formed on the second buffer layer, and formed of one oxide-based ceramic material selected from the group consisting of $TiO_y$, $ZrO_y$, and $Al_2O_z$ where the composition of oxygen is $1<y<2$, or $2<z<3$.

Another aspect of the present invention provides a hydrogen separation membrane which includes a porous support, a buffer layer formed in the form of a plurality of columns on the porous support, and made of an oxide-based ceramic material such as $MO_y$, (M is Ti or Zr) where the composition of oxygen is $1<y<2$, or $Al_2O_z$ where the composition of oxygen is $2<z<3$, and a palladium-based metal separation membrane formed on the buffer layer.

Still another aspect of the present invention provides a method for manufacturing a hydrogen separation membrane, which includes preparing a porous support made of a metal or ceramic material, forming a buffer layer in the form of a plurality of columns on the porous support, wherein the buffer layer is made of a ceramic material, and formed of a plurality of layers, and forming a palladium-based metal separation membrane, which is able to separate hydrogen, on the buffer layer.

For the method for manufacturing a hydrogen separation membrane according to one exemplary embodiment of the present invention, in the forming of the buffer layer, the buffer layer may be formed of an oxide-based ceramic material such as $MO_y$, (M is Ti or Zr) where the composition of oxygen is $1<y<2$, or $Al_2O_z$ where the composition of oxygen is $2<z<3$.

For the method for manufacturing a hydrogen separation membrane according to one exemplary embodiment of the present invention, in the forming of the buffer layer, the buffer layer may be formed at a vacuum condition by means of a sputtering process using a target as $MO_2$ or $Al_2O_3$.

For the method for manufacturing a hydrogen separation membrane according to one exemplary embodiment of the present invention, in the forming of the buffer layer, the buffer layer may be formed by supplying oxygen gas to an M metal plate or powder used as a source and oxidizing the M metal plate or powder by a reaction of evaporated M with the oxygen gas to grow on the porous support in the form of columns.

For the method for manufacturing a hydrogen separation membrane according to one exemplary embodiment of the present invention, the forming of the buffer layer may include forming a first buffer layer on the porous support wherein the first buffer layer is formed of one oxide-based ceramic material selected from the group consisting of $TiO_y$, $ZrO_y$, and $Al_2O_z$ where the composition of oxygen is $1<y<2$, or $2<z<3$, forming a second buffer layer on the first buffer layer wherein the second buffer layer is formed of an oxide-based ceramic material including one selected from the group consisting of Ti, Zr, Al, Si, Ce, La, Sr, Cr, V, Nb, Ga, Ta, W, and Mo, and forming a third buffer layer on the second buffer layer wherein the third buffer layer is formed of one oxide-based ceramic material selected from the group consisting of $TiO_y$, $ZrO_y$, and $Al_2O_z$ where the composition of oxygen is $1<y<2$, or $2<z<3$.

Yet another aspect of the present invention provides a method for manufacturing a hydrogen separation membrane, which includes preparing a porous support, forming a buffer layer in the form of a plurality of columns on the porous support, wherein the buffer layer is made of an oxide-based ceramic material such as $MO_y$, (M is Ti or Zr) where the composition of oxygen is $1<y<2$, or $Al_2O_z$ where the composition of oxygen is $2<z<3$, and forming a palladium-based metal separation membrane, which is able to separate hydrogen, on the buffer layer.

For the method for manufacturing a hydrogen separation membrane according to one exemplary embodiment of the present invention, in the forming of the metal separation membrane, the palladium-based metal separation membrane may be formed on the buffer layer using a physical vapor deposition method.

Advantageous Effects

According to exemplary embodiments of the present invention, the diffusion between a porous support and a metal separation membrane can be restrained by forming a buffer layer made of a ceramic material in the form of columns between the porous support and the metal separation membrane, and a good bonding force between the porous support and the metal separation membrane with the buffer layer sandwiched therebetween can also be ensured. Since such a buffer layer is formed in the form of a plurality of separate columns or a plurality of clusters, the buffer layer can effectively cope with contractions and expansions, thereby giving a good bonding force between the porous support and the metal separation membrane.

Also, when the composition of oxygen in $MO_y$, (M is a metal such as Ti, Zr, or Al) is adjusted for the buffer layer, a good bonding force between the porous support and the metal separation membrane with the buffer layer disposed therebetween can be provided.

When the good bonding force between the porous support and the metal separation membrane with such a buffer layer disposed therebetween is provided, a hydrogen permeation rate of the hydrogen separation membrane can be ultimately improved.

Also, the hydrogen separation membrane according to one exemplary embodiment of the present invention can provide a hydrogen separation membrane which may be easily modularized and has improved durability when a buffer layer made of a ceramic material is formed in the form of columns between the porous support and the metal separation membrane, and a metal material is used for the porous support, and can also provide a method for manufacturing a hydrogen separation membrane, which is easy to mass-produce.

Further, because the hydrogen separation membrane according to one exemplary embodiment of the present invention can be easily manufactured as a coating film and has characteristics as a porous support, it can be easily modularized, and therefore can be competitively priced because it can be applied not only to hydrogen preparation and purification processes, but also to a large-scale hydrogen separation process such as carbon dioxide capture and storage (CCS). Accordingly, the hydrogen separation membrane is expected to be effectively used as a main material in fields of realizing a hydrogen-economy society and preventing global warming.

BEST MODE

In the following description, detailed descriptions of well-known functions or constructions will be omitted since they would obscure the invention in unnecessary detail.

It should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Hereinafter, exemplary embodiments of the present invention will be described in further detail with reference to the accompanying drawings.

First Embodiment

Figure 1:
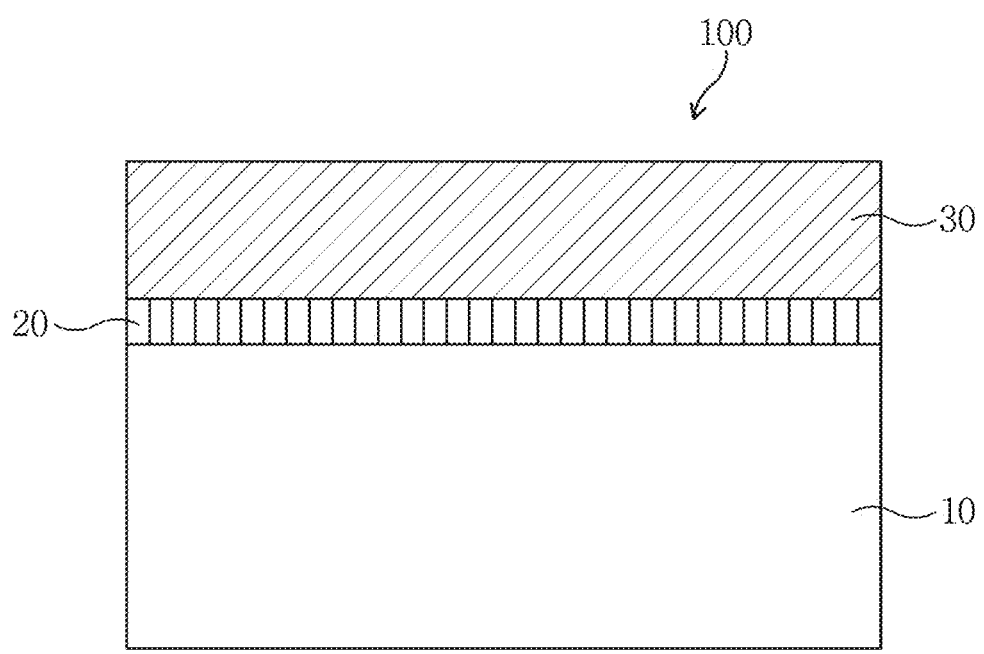
FIG. 1 is a cross-sectional view showing a hydrogen separation membrane according to a first embodiment of the present invention.

FIG. 1 is a cross-sectional view showing a hydrogen separation membrane according to a first embodiment of the present invention.

Referring to FIG. 1, the hydrogen separation membrane 100 according to the first embodiment includes a porous support 10 made of a metal or ceramic material, a buffer layer 20 made of a ceramic material and formed in the form of a plurality of columns on the porous support 10, and a palladium-based metal separation membrane 30 formed on the buffer layer 20 and capable of separating hydrogen.

Here, the porous support 10 may be a porous metal, a porous ceramic, or a porous metal coated with ceramic. Stainless steel, nickel, Inconel, and the like may be used as a material of the porous metal. Oxides based on Al, Ti, Zr, Si, and the like may be used as a material of the porous ceramic. It is desirable that the size of surface pores formed on the porous support 10 be not too small. For example, when the size of the surface pores of the porous support 10 is less than 0.01 μm, it is difficult to perform the functions as the porous support 10 due to low permeability of the porous support 10 itself. On the other hand, when the size of the surface pores is greater than 20 μm, the thick metal separation membrane 30 may be formed due to an increase in diameter of the pores. Therefore, it is desirable that the surface pores of the porous support 10 be formed so that the surface pores have a size of 0.01 μm to 20 μm.

The buffer layer 20 is used as an adhesive layer since the buffer layer 20 serves to restrain the diffusion between the porous support 10 and the metal separation membrane 30 and simultaneously give a good bonding force between the porous support 10 and the metal separation membrane 30. Such a buffer layer 20 may be formed of an oxide-based ceramic material. That is, the buffer layer 20 may be formed of an oxide-based ceramic material such as $MO_y$ (M is Ti, or Zr) where the composition of oxygen is $1<y<2$, or $Al_2O_z$ where the composition of oxygen is $2<z<3$. For example, $TiO_y$, $ZrO_y$, or $Al_2O_z$ ($1<y<2$, or $2<z<3$) may be used as the buffer layer 20. The first embodiment discloses a case in which the buffer layer 20 is formed of a single layer.

In this case, forming the buffer layer 20 with the composition as described above is to provide a good bonding force between the porous support 10 and the metal separation membrane 30 with the buffer layer 20 disposed therebetween. That is, the buffer layer 20 exhibits stronger metallicity than a ceramic property when y is less than or equal to 1, or z is less than or equal to 2. Therefore, the hydrogen permeability may be reduced due to the interdiffusion between the porous support 10 and the metal separation membrane 30 including the buffer layer 20. On the other hand, when $y>2$, or $z>3$, a bonding force between the porous support 10 and the metal separation membrane 30 with the buffer layer 20 disposed therebetween may be degraded. For example, the y value is preferably maintained in a range of 1.5 to 1.8, and the z value is preferably maintained in a range of 2.5 to 2.8.

When the columns forming the buffer layer 20 are compactly formed while being small in diameter, the diffusion may be restrained, a bonding force between the porous support 10 and the metal separation membrane 30 with the buffer layer 20 disposed therebetween may be improved, and the hydrogen permeability may also be improved. For example, the columns forming the buffer layer 20 may be formed so that the columns have a diameter of 10 to 200 nm. When the diameter of the columns is greater than 200 nm, a saturated area may be reduced. As a result, the hydrogen permeability may be degraded, and a bonding force between the porous support 10 and the metal separation membrane 30 with the buffer layer 20 disposed therebetween may be reduced. Although it is preferred that the columns be formed so that the columns have a diameter of 10 nm or less, it is difficult to manufacture the columns compactly in a manufacturing process.

The thickness of the buffer layer 20 may be determined in consideration of the manufacturing and usage conditions of the hydrogen separation membrane 100. For example, when $TiO_y$ is formed into the buffer layer 20 in consideration of the usage condition of 400° C., the buffer layer 20 may be formed to a thickness of 100 to 200 nm. A physical vapor deposition method such as sputtering may be used as a method of forming the buffer layer 20.

Also, the metal separation membrane 30 may be formed of a palladium-based metal by coating. The metal separation membrane 30 may be formed using a physical vapor deposition method such as sputtering. The palladium-based metal has a multi-layered structure including palladium or a palladium alloy, and a dissimilar metal containing palladium. The palladium alloy may be an alloy of Pd and one metal selected from the group consisting of Au, Ag, Cu, Ni, Ru, and Rh. The multi-layered structure includes Pd/Cu, Pd/Au, Pd/Ag, Pd/Pt, and the like, but the present invention is not limited thereto.

When palladium is used in the metal separation membrane 30, the metal separation membrane 30 may be formed to a thickness of 0.1 to 10 μm. When the thickness of the metal separation membrane 30 is less than or equal to 0.1 μm, the hydrogen permeability may be further improved, but it is difficult to compactly manufacture the metal separation membrane 30 with a thickness of 0.1 μm or less, resulting in a decrease in lifespan of the metal separation membrane 30. When the metal separation membrane 30 is formed to a thickness of 10 μm or more in this aspect, the metal separation membrane 30 may be compactly manufactured, but the hydrogen permeability may be relatively reduced. Also, when the metal separation membrane is formed at the thickness of 10 μm or more using expensive palladium, the overall manufacturing cost of the hydrogen separation membrane may increase. Therefore, when the metal separation membrane 30 is formed using palladium, the metal separation membrane 30 is formed to a thickness of 0.1 to 10 μm. Preferably, the metal separation membrane 30 is formed to a thickness of 3 to 5 μm in consideration of lifespan characteristics, hydrogen permeability and the like of the metal separation membrane.

As described above, the hydrogen separation membrane 100 according to the first embodiment may restrain the diffusion between the porous support 10 and the metal separation membrane 30 and also ensure a good bonding force between the porous support 10 and the metal separation membrane 30 with the buffer layer 20 disposed therebetween when the buffer layer 20 made of a ceramic material in the form of columns is formed between the porous support 10 and the metal separation membrane 30. Since such a buffer layer 20 is formed in the form of a plurality of separate columns or a plurality of clusters, the buffer layer 20 may effectively cope with contractions and expansions, thereby giving a good bonding force between the porous support 10 and the metal separation membrane 30.

Also, when the buffer layer 20 is formed of $MO_y$ (M is Ti, or Zr) where the composition of oxygen is $1<y<2$, or $Al_2O_z$ where the composition of oxygen is $2<z<3$, a good bonding force between the porous support 10 and the metal separation membrane 30 with the buffer layer 20 disposed therebetween may be provided.

As described above, when the good bonding force between the porous support 10 and the metal separation membrane 30 with the buffer layer 20 disposed therebetween is provided, a hydrogen permeation rate of the hydrogen separation membrane 100 may be ultimately improved.

Figure 2:
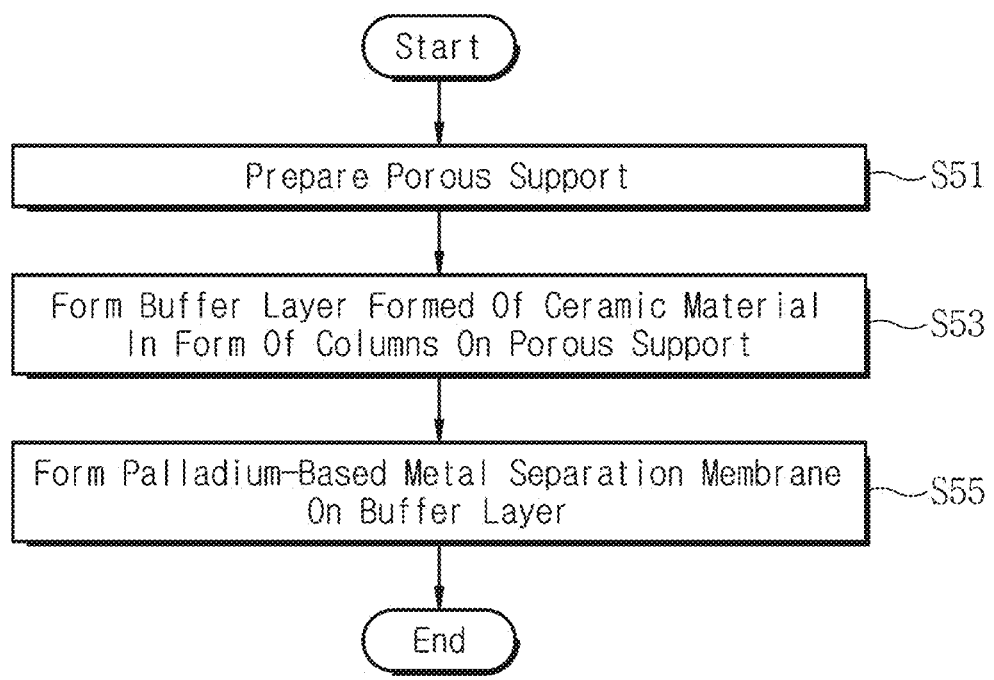
FIG. 2 is a flowchart of a method for manufacturing a hydrogen separation membrane as shown in FIG. 1.
Figure 3:
FIGS. 3 and 4 are diagrams showing respective operations of the manufacturing method as shown in FIG. 2.
Figure 4:
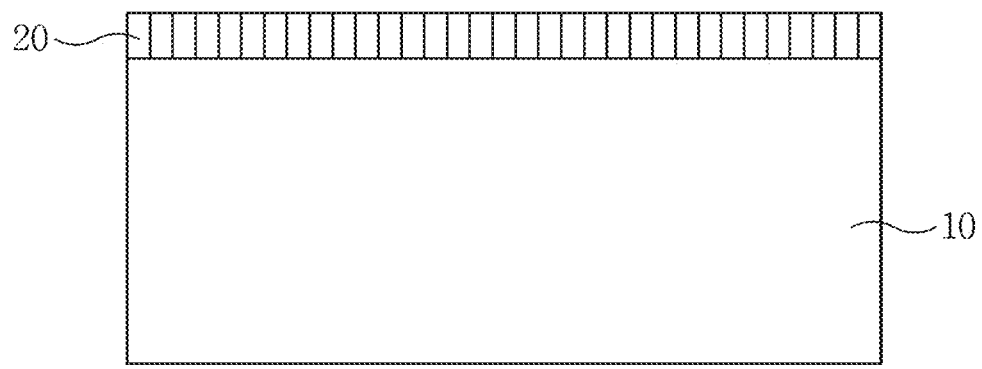

Such a method for manufacturing a hydrogen separation membrane 100 according to the first embodiment will be described with reference to FIGS. 1 to 4, as follows. Here, FIG. 2 is a flowchart of a method for manufacturing a hydrogen separation membrane 100 as shown in FIG. 1. FIGS. 3 and 4 are diagrams showing respective operations of the manufacturing method as shown in FIG. 2.

As shown in FIG. 3, first, a porous support 10 is prepared in operation S51. In this case, a metal or ceramic material may be used in the porous support 10. In this case, a surface treatment process may be performed to adjust surface roughness of the porous support 10. A grinding process such as chemical mechanical polishing (CMP), or a process using plasma may be used as the surface treatment method.

Next, as shown in FIG. 4, a buffer layer 20 made of a ceramic material is formed in the form of columns on the porous support 10 in operation S53. That is, the buffer layer 20 is formed on the porous support 10 using a physical vapor deposition method. In this case, the buffer layer 20 is formed of an oxide-based ceramic material such as $MO_y$ (M is Ti, or Zr) where the composition of oxygen is $1<y<2$, or $Al_2O_z$ where the composition of oxygen is $2<z<3$.

Such a buffer layer 20 may be formed at a vacuum condition by means of a sputtering process using $MO_2$ or $Al_2O_3$ as a target. For example, when $TiO_2$ is used as the target in a sputtering process to perform vapor deposition, $TiO_y$ may be formed into the buffer layer 20 so that the composition of oxygen is $y<2$ since this process is performed at a vacuum condition.

Also, the buffer layer 20 may be formed by supplying oxygen gas to an M metal plate or powder used as a source and oxidizing the M metal plate or powder by a reaction of evaporated M with the oxygen gas to grow on the porous support in the form of columns so that the composition of oxygen is $y<2$. For example, the buffer layer 20 may be formed using the Ti metal target or powder as a source by supplying $O_2$ in an atmosphere gas and oxidizing the M metal plate or powder by a reaction of evaporated M with $O_2$ to grow in the form of columns In this manufacturing method, the buffer layer 20 is formed of a single layer. For example, the buffer layer 20 may be formed of one selected from the group consisting of $TiO_y$, $ZrO_y$, and $Al_2O_z$.

Then, as shown in FIG. 1, a palladium-based metal separation membrane 30 is formed on the buffer layer 20 in operation S55. In this case, the metal separation membrane 30 may be formed using a physical vapor deposition method such as sputtering. In such a manufacturing method, a case in which the metal separation membrane 30 is formed by sputtering palladium is provided.

Figure 5:
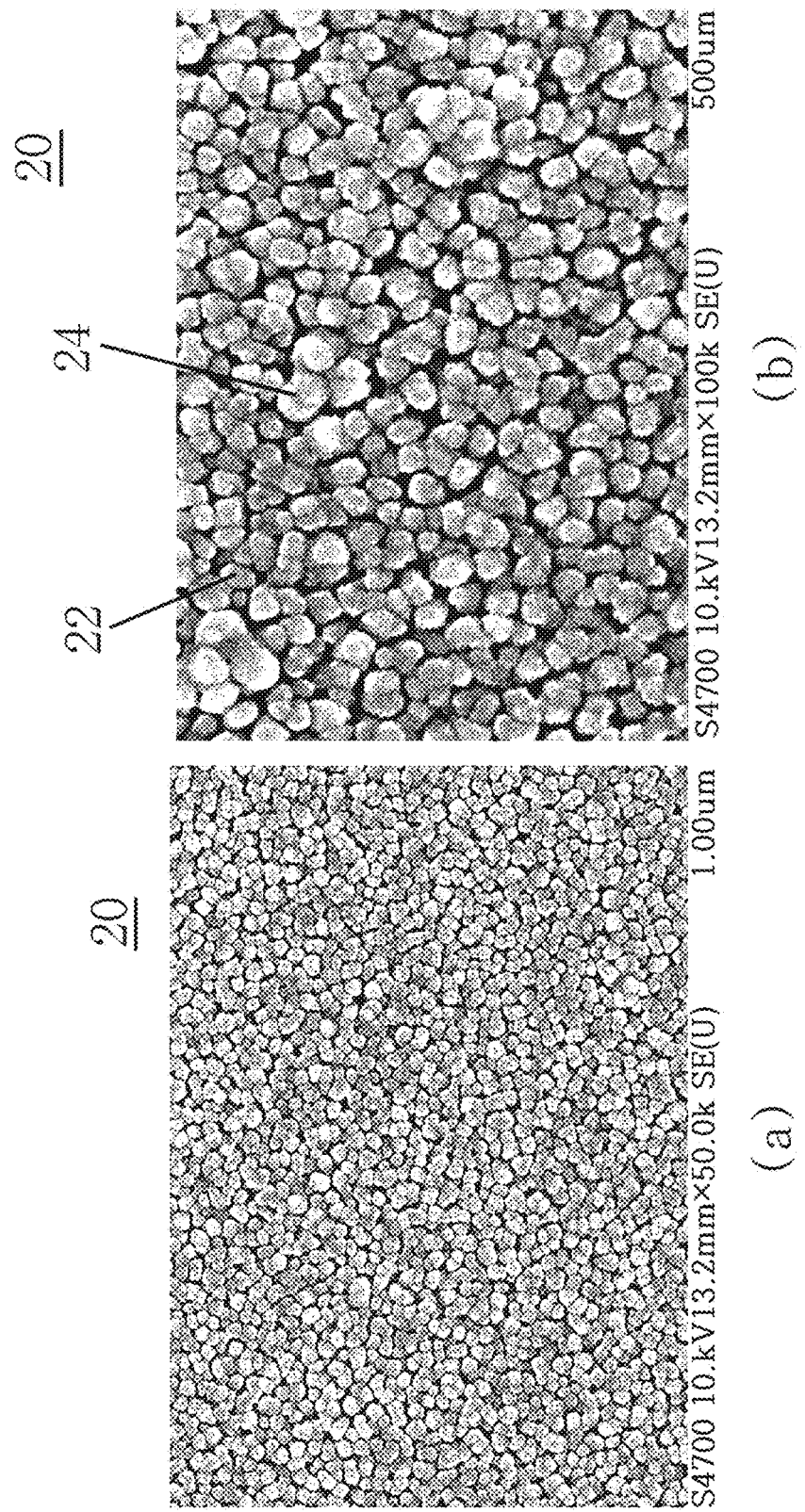
FIG. 5 is a surface image showing a buffer layer of the hydrogen separation membrane according to the first embodiment of the present invention.
Figure 6:
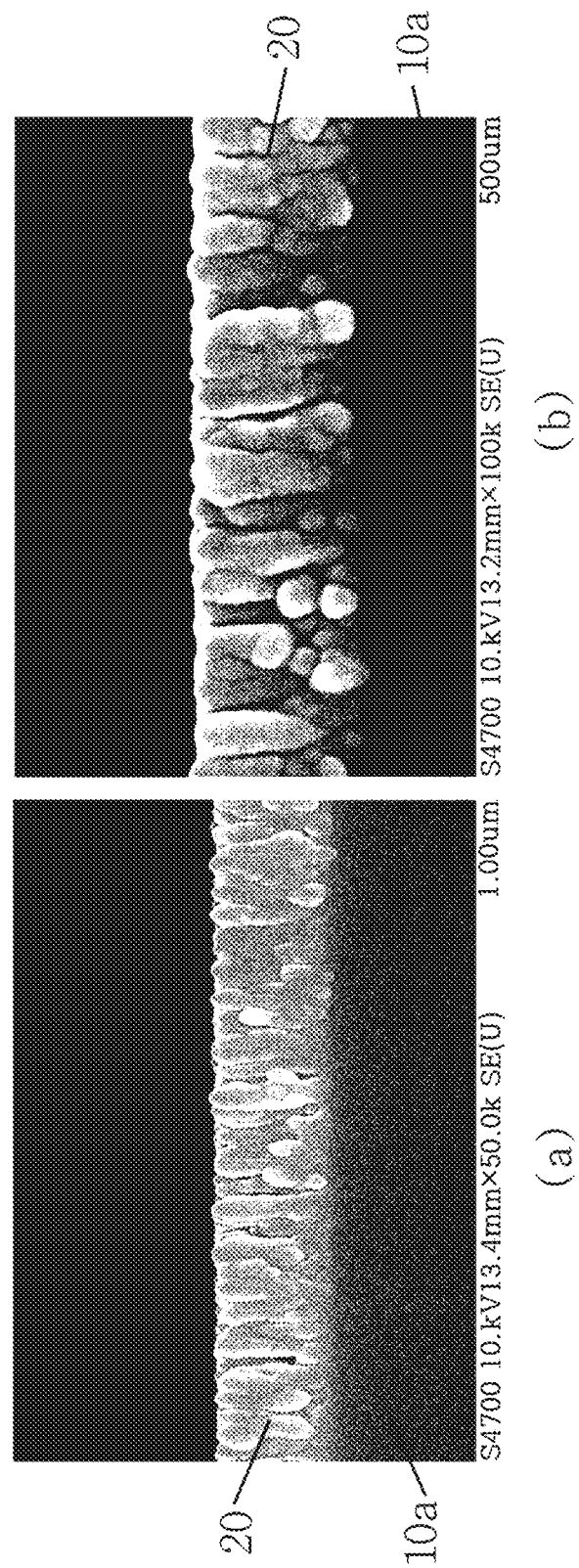
FIG. 6 is a cross-sectional image showing the buffer layer as shown in FIG. 5.

Such a buffer layer 20 of the hydrogen separation membrane 100 according to the first embodiment may be formed as shown in FIGS. 5 and 6. Here, FIG. 5 is a surface image showing a buffer layer 20 of the hydrogen separation membrane according to the first embodiment of the present invention. FIG. 6 is a cross-sectional image showing the buffer layer 20 as shown in FIG. 5.

Referring to FIGS. 5 and 6, to confirm whether the buffer layer is formed in the form of a plurality of columns on the porous support, a compact silicon wafer 10a which may replace the porous support is used.

Also, the buffer layer 20 is formed of $ZrO_y$ (y=1.5 to 1.8) on the silicon wafer 10a. For example, the buffer layer 20 may be formed at a vacuum condition by a sputtering process using $ZrO_2$ as a target. The buffer layer 20 may be formed in the form of columns by supplying oxygen gas to an M metal plate or powder used as a source and oxidizing the M metal plate or powder by a reaction of evaporated M with the oxygen gas.

It may be confirmed that the buffer layer 20 is compactly formed in the form of a plurality of columns 22 on the silicon wafer. Also, it may be confirmed that the diameter of the columns 22 forming the buffer layer 20 is in a range of 30 to 50 nm Further, it may be confirmed that the plurality of columns 22 of the buffer layer 20 may be formed separately, or formed in the form of a plurality of clusters 24.

Second Embodiment

Meanwhile, the first embodiment proposes that the buffer layer 20 is formed of a single layer, but the present invention is not limited thereto. For example, the buffer layer 20 may be formed of two layers, as show in FIG. 7.

Figure 7:
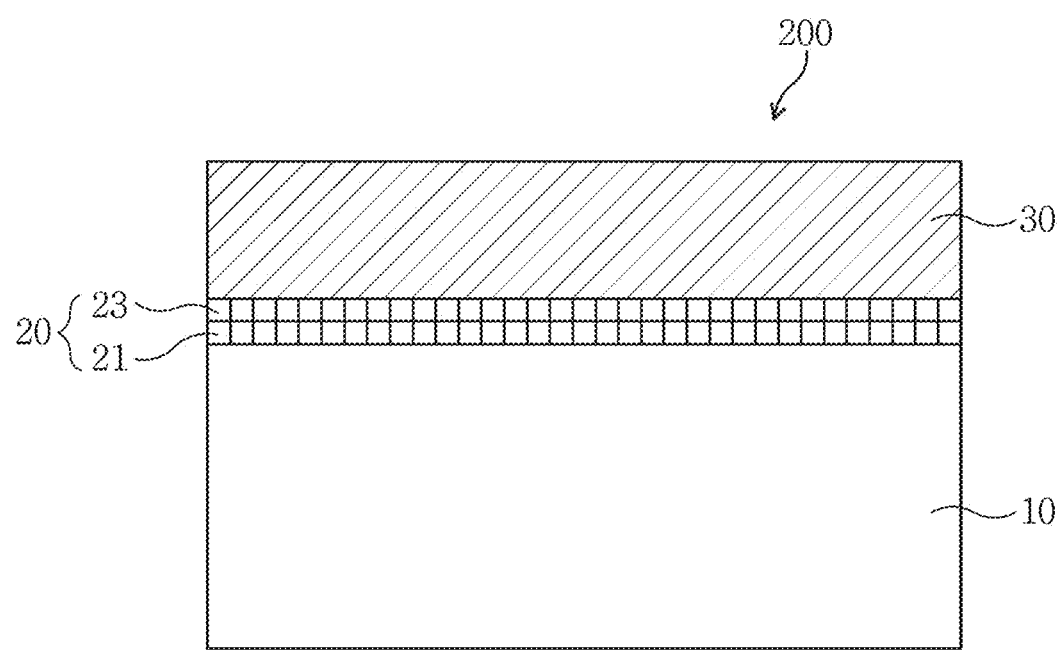
FIG. 7 is a cross-sectional view showing a hydrogen separation membrane according to a second embodiment of the present invention.

FIG. 7 is a cross-sectional view showing a hydrogen separation membrane 200 according to a second embodiment of the present invention.

Referring to FIG. 7, the hydrogen separation membrane 200 according to the second embodiment includes a porous support 10, a buffer layer 20 made of a ceramic material and formed in the form of a plurality of columns on the porous support 10, and a palladium-based metal separation membrane 30 formed on the buffer layer 20 and capable of separating hydrogen. In this case, the buffer layer 20 according to the second embodiment is formed of two layers.

The buffer layer 20 includes a first buffer layer 21 formed on the porous support 10, and a second buffer layer 23 formed on the first buffer layer 21. The first buffer layer 21 and the second buffer layer 23 may be formed of different oxide-based ceramic materials. For example, when the first buffer layer 21 is formed of $ZrO_y$, the second buffer layer 23 may be formed of $TiO_y$ or $Al_2O_z$. When the first buffer layer 21 is formed of $ZrO_y$, the first buffer layer 21 may be formed to a thickness of 100 to 1,000 nm. When the second buffer layer 23 is formed of $TiO_y$, the second buffer layer 23 may be formed to a thickness of 10 to 200 nm. In this case, the first buffer layer 21 serves as a shield layer which prevents the diffusion while improving hydrogen permeability, and the second buffer layer 23 serves as an adhesive layer.

Figure 8:
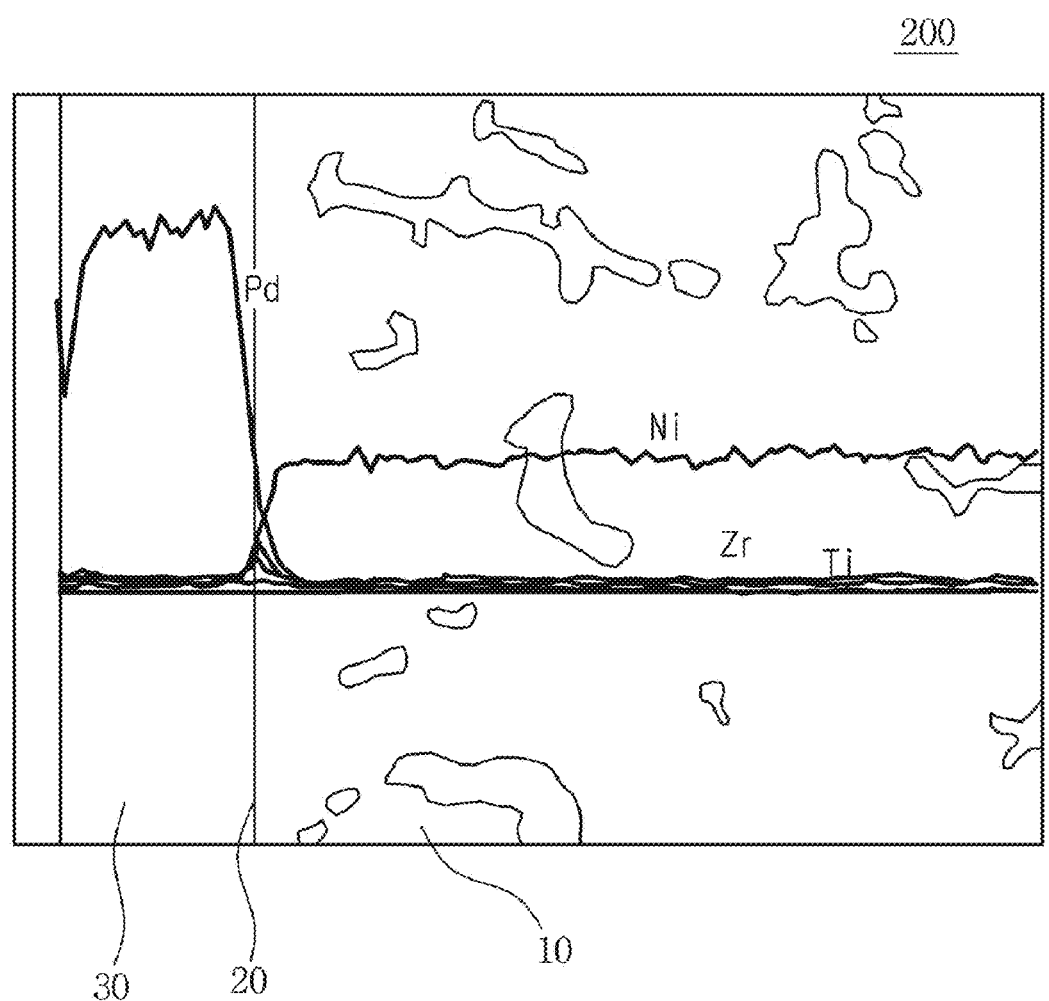
FIG. 8 is a diagram showing the cross-sectional energy-dispersive X-ray spectroscopy (EDX) line scan results of a hydrogen separation membrane according to a third embodiment of the present invention.

When such a buffer layer 20 is formed of two layers using different types of ceramic materials, the diffusion between the porous support 10 and the metal separation membrane 30 may be restrained, and a good bonding force between the porous support 10 and the metal separation membrane 30 with the buffer layer 20 disposed therebetween may be provided. As shown in FIG. 8, it can be confirmed that the diffusion between the porous support 10 and the metal separation membrane 30 may be restrained for such a hydrogen separation membrane 200 according to the second embodiment. Here, FIG. 8 is a diagram showing the cross-sectional EDX line scan results of a hydrogen separation membrane according to the second embodiment of the present invention.

Referring to FIG. 8, the hydrogen separation membrane 200 according to the second embodiment was subjected to a hydrogen permeation process at 400° C. for 1,100 hours, and cross-sectional EDX line scans was performed on the hydrogen separation membrane 200. A porous nickel support (PNS) was used as the porous support 10. $ZrO_y/TiO_y$ is used as the buffer layer 20. Also, palladium was used in the metal separation membrane 30.

Based on the cross-sectional EDX line scan results of the hydrogen separation membrane 300, it could be seen that a nickel component was mainly detected in the porous support 10, and Pd, Zr, and Ti were hardly detected. Also, it could be seen that a Pd component was mainly detected in the metal separation membrane 30, and Ni, Zr, and Ti components were hardly detected. Further, it could be seen that the Pd and Ni components were separated on the basis of the buffer layer 20.

As described above, it was revealed that the hydrogen separation membrane 200 according to the second embodiment the interdiffusion between the porous support 10 and the metal separation membrane 30 was restrained since the hydrogen separation membrane 200 had the buffer layer 20, which was made of a ceramic material in the form of the columns, between the porous support 10 and the metal separation membrane 30.

Third Embodiment

Meanwhile, a case in which the buffer layer 20 is formed of two layers in the hydrogen separation membrane 200 according to the second embodiment, but the present invention is not limited thereto. For example, the buffer layer 20 may be formed of three layers, as show in FIG. 9.

Figure 9:
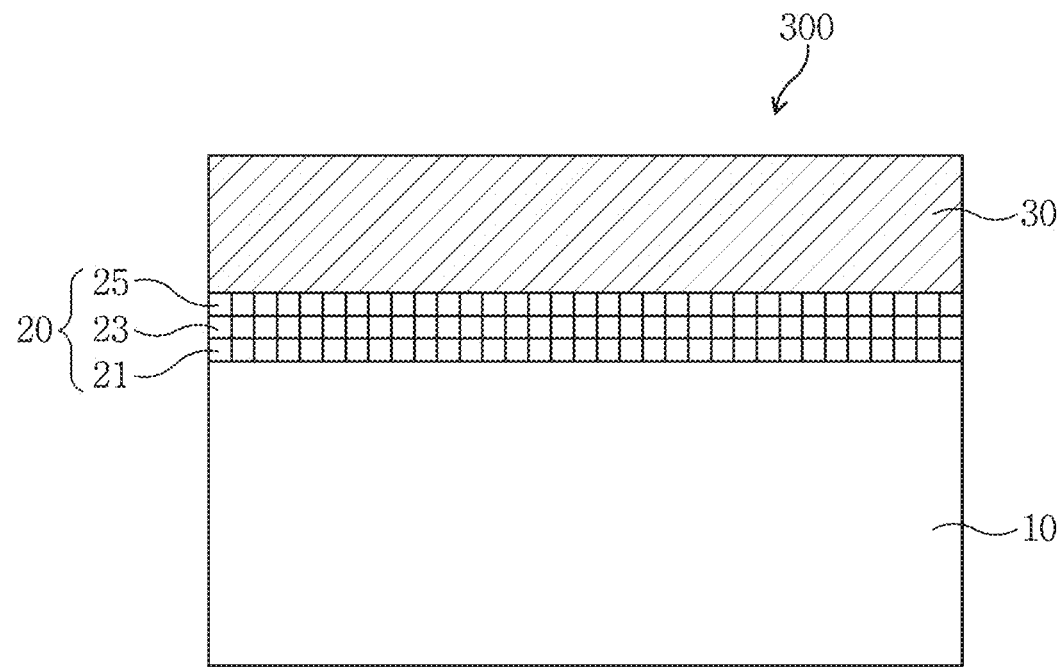
FIG. 9 is a cross-sectional view showing the hydrogen separation membrane according to the third embodiment of the present invention.

FIG. 9 is a cross-sectional view showing a hydrogen separation membrane 300 according to a third embodiment of the present invention.

Referring to FIG. 9, the hydrogen separation membrane 300 according to the third embodiment includes a porous support 10, a buffer layer 20 made of a ceramic material and formed in the form of a plurality of columns on the porous support 10, and a palladium-based metal separation membrane 30 formed on the buffer layer 20 and capable of separating hydrogen. In this case, the buffer layer 20 according to the third embodiment may be formed of three layers.

The buffer layer 20 includes a first buffer layer 21 formed on the porous support 10, a second buffer layer 23 formed on the first buffer layer 21, and a third buffer layer 25 formed on the second buffer layer 23. For the first to third buffer layers 21, 23 and 25, the neighboring buffer layers may be formed of different oxide-based ceramic materials. For example, when the second buffer layer 23 is formed of $ZrO_m$, the first and third buffer layers 21 and 25 may be formed of either $TiO_y$ or $Al_2O_z$. When the second buffer layer 23 is formed of $ZrO_y$, the second buffer layer 23 may be formed to a thickness of 100 to 1,000 nm. When the first and second buffer layers 21 and 25 are formed of $TiO_y$, the respective first and third buffer layers 21 and 25 may be formed to a thickness of 10 to 200 nm.

In this case, the first and third buffer layers 21 and 25 serve as an adhesive layer, and the second buffer layer 23 serves as a shield layer. The first and third buffer layers 21 and 25 is formed of one oxide-based ceramic material selected from the group consisting of $TiO_y$, $ZrO_y$, and $Al_2O_z$ where the composition of oxygen is $1<y<2$ or $2<z<3$. The second buffer layer 23 may be formed so that the first and third buffer layers 21 and 25 have the same composition. In this case, the first and third buffer layers 21 and 25 may be formed so that the composition is $y≥2$ and $z≥3$. Since the first and third buffer layers 21 and 25 are present at both sides of the second buffer layer 23, the first and third buffer layers 21 and 25 may have adhesive and shield functions even when the composition of the second buffer layer 23 is $y≥2$ and $z≥3$. An oxide-based ceramic material including one metal selected from the group consisting of Ti, Zr, Al, Si, Ce, La, Sr, Cr, V, Nb, Ga, Ta, W, Mo, and the like may be used as such a second buffer layer 23.

Figure 10:
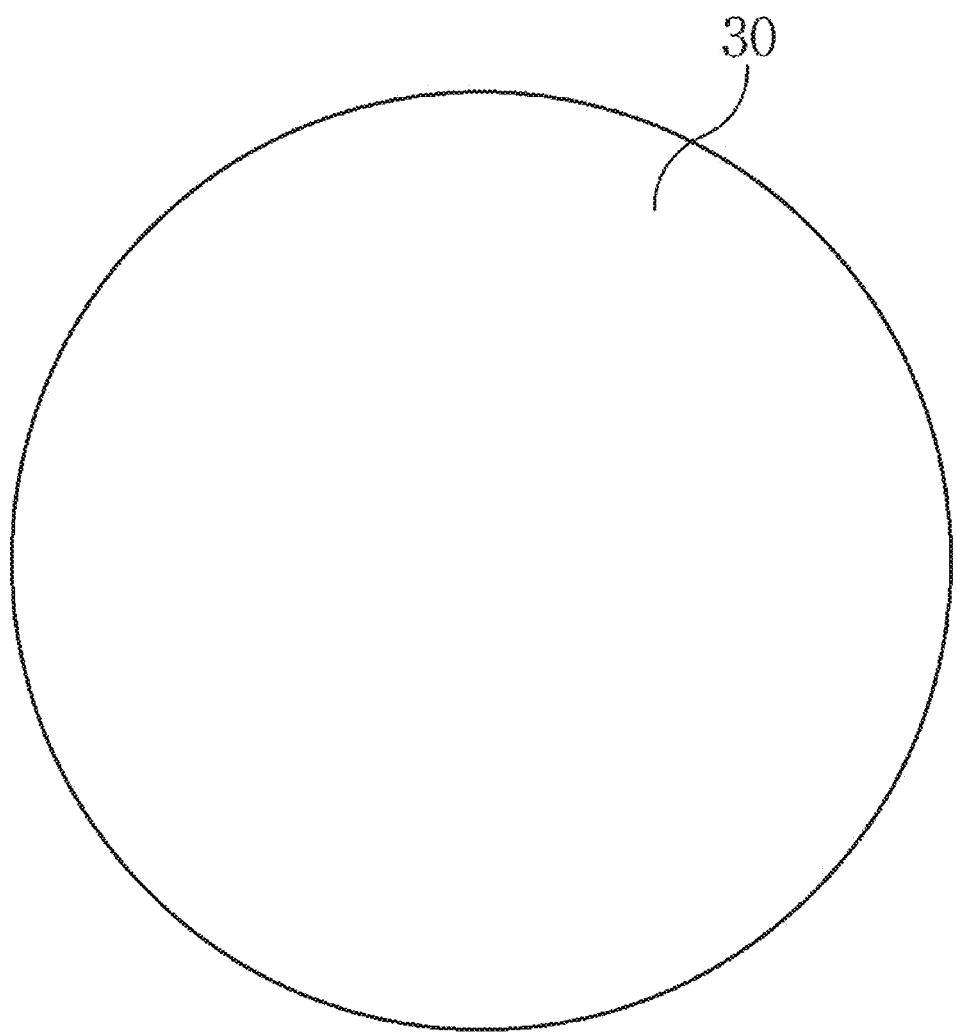
FIG. 10 is a diagram obtained by drawing an image of the hydrogen separation membrane according to the third embodiment of the present invention.
Figure 11:
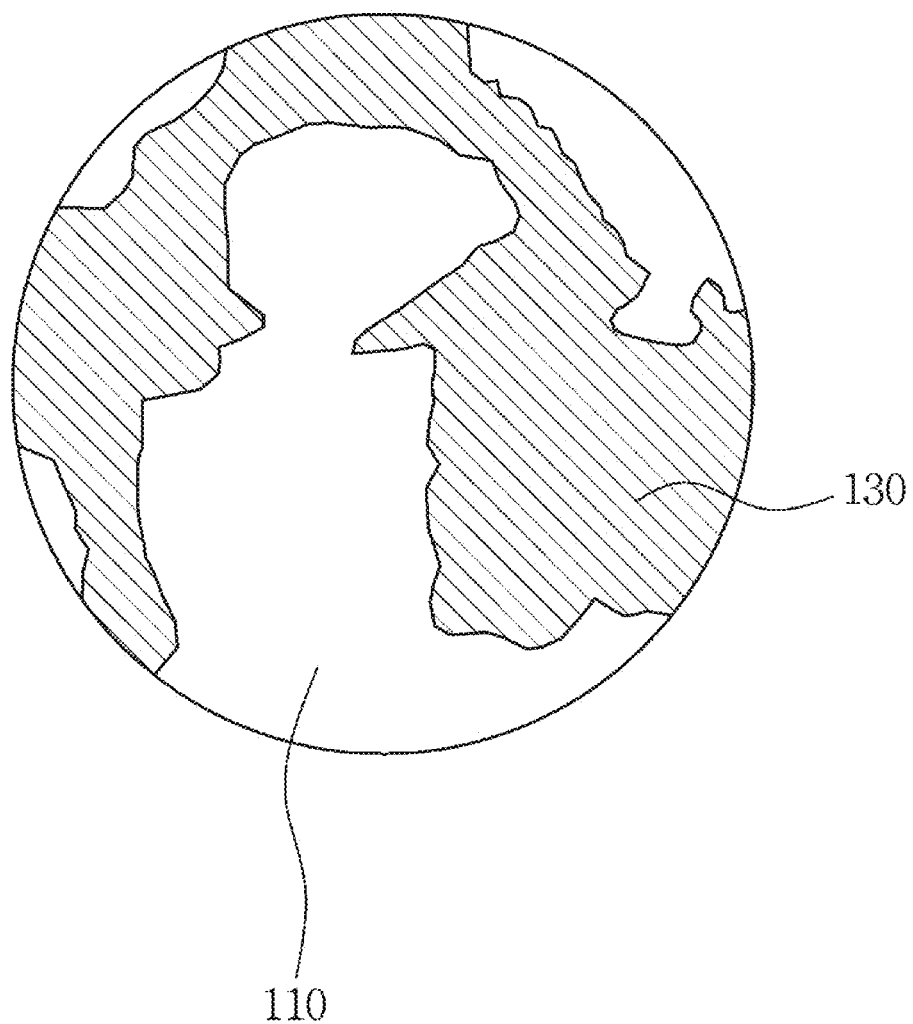
FIG. 11 is a diagram obtained by drawing an image of a hydrogen separation membrane according to a comparative example of the present invention.

The bonding characteristics between the porous support and the metal separation membrane with such a buffer layer of the hydrogen separation membrane according to third embodiment and comparative example are confirmed as shown FIGS. 10 and 11, respectively. Here, FIG. 10 is a diagram obtained by drawing an image of the hydrogen separation membrane 300 according to the third embodiment of the present invention. FIG. 11 is a diagram obtained by drawing an image of a hydrogen separation membrane 400 according to a comparative example of the present invention.

For the hydrogen separation membrane 300 according to the third embodiment, a buffer layer was formed on formed on porous stainless steel by sequentially sputtering $TiO_y$, $ZrO_y$, and $TiO_y$, and a metal separation membrane 30 was then formed on the buffer layer by sputtering palladium.

Also, for the hydrogen separation membrane 400 according to the comparative example, a buffer layer of $ZrO_y$ was formed on porous stainless steel using a sol-gel method, and a metal separation membrane 130 was then formed on the buffer layer by sputtering palladium.

The hydrogen separation membranes 300 and 400 undergoing a grinding process such as CMP after formation of both the metal separation membranes 30 and 130 according to the third embodiment and comparative example are shown in FIGS. 10 and 11. In this case, the CMP grinding process is performed using alumina slurry. In this case, pin holes formed on a surface of the separation membrane are removed by means of such a CMP grinding process.

Referring to FIG. 10, it could be seen that the metal separation membrane 30 made of palladium was not peeled off from the porous stainless steel in the case of the third embodiment, indicating that the bonding force between the porous support and the metal separation membrane 30 with the buffer layer disposed therebetween was good.

Referring to FIG. 11, however, it could be seen that the metal separation membrane 130 made of palladium was peeled off from the porous stainless steel 110 in the case of the comparative example. That is, it was revealed that the bonding force between the porous support 110 and the metal separation membrane 130 with the buffer layer sandwiched therebetween by a sol-gel method was poor.

In this specification, exemplary embodiments of the present invention have been classified into the first, second and third exemplary embodiments and described for conciseness. However, respective steps or functions of an exemplary embodiment may be combined with those of another exemplary embodiment to implement still another exemplary embodiment of the present invention.

The invention claimed is:

1. A hydrogen separation membrane comprising:
   a porous support made of a metal or ceramic material;
   a buffer layer made of a ceramic material, and formed in the form of a plurality of columns on the porous support, wherein the buffer layer is formed of a plurality of layers; and
   a palladium-based metal separation membrane formed on the buffer layer and capable of separating hydrogen,
   wherein the buffer layer has neighboring layers formed of different ceramic materials, the buffer layer comprises:
   a first buffer layer formed on the porous support, and formed of one oxide-based ceramic material selected from the group consisting of $TiO_y$, $ZrO_y$, and $Al_2O_z$ where the composition of oxygen is $1<y<1.8$, or $2<z<2.8$; and
   a second buffer layer formed on the first buffer layer, and formed of an oxide-based ceramic material comprising one selected from the group consisting of Ti, Zr, Al, Si, Ce, La, Sr, Cr, V, Nb, Ga, Ta, W, and Mo.

2. The hydrogen separation membrane of claim 1, wherein the buffer layer is in the form of the plurality of columns having a diameter of 10 to 200nm.

3. The hydrogen separation membrane of claim 2, wherein the plurality of columns of the buffer layer are formed separately, or formed in the form of a plurality of clusters.

4. The hydrogen separation membrane of claim 1, wherein the buffer layer comprises:
   a third buffer layer formed on the second buffer layer, and formed of one oxide-based ceramic material selected from the group consisting of $TiO_y$, $ZrO_y$, and $Al_2O_z$ where the composition of oxygen is $1<y<1.8$, or $2<z<2.8$.

5. A method for manufacturing a hydrogen separation membrane, comprising:
   preparing a porous support made of a metal or ceramic material;
   forming a buffer layer in the form of a plurality of columns on the porous support, wherein the buffer layer is made of a ceramic material, and formed of a plurality of layers; and
   forming a palladium-based metal separation membrane, which is able to separate hydrogen, on the buffer layer,
   wherein the buffer layer has neighboring layers formed of different ceramic materials,
   the forming of the buffer layer comprises:
   forming a first buffer layer on the porous support wherein the first buffer layer is formed of one oxide-based ceramic material selected from the group consisting of $TiO_y$, $ZrO_y$, and $Al_2O_z$ where the composition of oxygen is $1<y<2$, or $2<z<3$;
   forming a second buffer layer on the first buffer layer wherein the second buffer layer is formed of an oxide-based ceramic material comprising one selected from the group consisting of Ti, Zr, Al, Si, Ce, La, Sr, Cr, V, Nb, Ga, Ta, W, and Mo; and
   forming a third buffer layer on the second buffer layer wherein the third buffer layer is formed of one oxide-based ceramic material selected from the group consisting of $TiO_y$, $ZrO_y$, and $Al_2O_z$ where the composition of oxygen is $1<y<2$, or $2<z<3$.

6. The method of claim 5, wherein, in the forming of the buffer layer, the buffer layer is formed at a vacuum condition by means of a sputtering process using a target as $MO_2$ (M is Ti or Zr) or $Al_2O_3$.

7. The method of claim 5, wherein, in the forming of the buffer layer, the buffer layer is formed by supplying oxygen gas to an M metal plate or powder used as a source and oxidizing the M metal plate or powder by a reaction of evaporated M with the oxygen gas to grow on the porous support in the form of columns.

8. The method of claim 5, wherein, in the forming of the metal separation membrane, the palladium-based metal separation membrane is formed on the buffer layer using a physical vapor deposition method.

9. A hydrogen separation membrane comprising:
   a porous support made of a metal or ceramic material;
   a buffer layer made of a ceramic material, and formed in the form of a plurality of columns on the porous support, wherein the buffer layer is formed of a plurality of layers; and
   a palladium-based metal separation membrane formed on the buffer layer and capable of separating hydrogen,
   wherein the buffer layer has neighboring layers formed of different ceramic materials,
   the buffer layer comprises:
   a first buffer layer formed on the porous support, and formed of one oxide-based ceramic material selected from the group consisting of $TiO_y$, $ZrO_y$, and $Al_2O_z$ where the composition of oxygen is $1<y<2$, or $2<z<3$;
   a second buffer layer formed on the first buffer layer, and formed of an oxide-based ceramic material comprising one selected from the group consisting of Ti, Zr, Al, Si, Ce, La, Sr, Cr, V, Nb, Ga, Ta, W, and Mo; and
   a third buffer layer formed on the second buffer layer, and formed of one oxide-based ceramic material selected from the group consisting of $TiO_y$, $ZrO_y$, and $Al_2O_z$ where the composition of oxygen is $1<y<2$, or $2<z<3$.

10. The hydrogen separation membrane of claim 9, wherein the buffer layer is in the form of the plurality of columns having a diameter of 10 to 200 nm.

11. The hydrogen separation membrane of claim 9, wherein the plurality of columns of the buffer layer are formed separately, or formed in the form of a plurality of clusters.

12. The hydrogen separation membrane of claim 9, wherein the composition of oxygen is $1.5<y<1.8$, or $2<z<2.8$.

13. The hydrogen separation membrane of claim 1, wherein the composition of oxygen is $1.5<y<1.8$, or $2<z<2.8$.

14. The method for manufacturing a hydrogen separation membrane of claim 5, wherein the composition of oxygen is $1.5<y<1.8$, or $2<z<2.8$.

\* \* \* \* \*